United States Patent [19]
Benhamida

[11] Patent Number: 5,109,163
[45] Date of Patent: Apr. 28, 1992

[54] INTEGRATED POWER-ON RESET CIRCUIT
[75] Inventor: Boubekeur Benhamida, Boise, Id.
[73] Assignee: Zilog, Inc., Campbell, Calif.
[21] Appl. No.: 656,419
[22] Filed: Feb. 15, 1991
[51] Int. Cl.$^5$ .................... H03K 17/20; H03K 17/22; H03K 5/153; H03K 17/687
[52] U.S. Cl. ............................... 307/272.3; 307/594; 307/597; 307/296.5
[58] Field of Search .................... 307/272.3, 279, 592, 307/594, 597, 603, 296.5

[56] References Cited
U.S. PATENT DOCUMENTS

| | | | |
|---|---|---|---|
| 4,446,381 | 5/1984 | Dalrymple | 307/272.3 |
| 4,634,905 | 1/1987 | Campbell, Jr. | 307/594 X |
| 4,797,584 | 1/1989 | Aguti et al. | 307/594 |
| 4,874,965 | 10/1989 | Campardo et al. | 307/272.3 |
| 4,886,984 | 12/1989 | Nakaoka | 307/272.3 |
| 4,888,498 | 12/1989 | Kadakia | 307/272.3 X |
| 4,902,907 | 2/1990 | Haga et al. | 307/594 X |
| 4,948,995 | 8/1990 | Takahashi | 307/272.3 X |
| 4,970,408 | 11/1990 | Hanke et al. | 307/272.3 |
| 4,983,857 | 1/1991 | Steele | 307/272.3 |

Primary Examiner—Edward P. Westin
Assistant Examiner—David R. Bertelson
Attorney, Agent, or Firm—Majestic, Parsons, Siebert & Hsue

[57] ABSTRACT

A circuit, which may be included as part of an integrated circuit chip including a microprocessor or other device needing initialization when being powered up, generates a reset signal at a time determined by the voltage rise characteristics of the power supply to the device when either initially turned on to the device or recovering from a voltage dip. A power supply sensing node of the circuit is initially discharged to ground potential in order to eliminate any effect of a charge on the node on the timing of the reset signal, such as might be generated by an ambient electromagnetic field.

14 Claims, 2 Drawing Sheets

INTEGRATED POWER-ON RESET CIRCUIT

BACKGROUND OF THE INVENTION

This invention relates generally to a reset circuit for use with a microprocessor or other integrated circuit device. More specifically, this invention relates to a reset circuit for generating a signal which resets elements in the device after a power supply is powered-up to a voltage sufficient for proper operation.

Microprocessors are powered by an external power supply which provides a range of voltages. When the power supply is initially turned on, the logic states of the electrical elements in the microprocessor must be initialized. After the states have been initialized and the chip is operating, the power may for some reason dip, causing the electrical components to change state or otherwise operate improperly. It is then necessary to reset the states of the circuitry when the power reaches a voltage sufficient to permit proper microprocessor operation.

In the past, off-chip reset circuits have been employed to initiate the resetting of the circuitry when the power supply reaches a sufficient voltage to permit proper operation. However, these off-chip circuits are undesirably large and utilize valuable circuit board space. With the advance of technology, microprocessor reset circuits have been developed which are implemented as part of the device chip, thereby obviating the use of an external pin for reset circuitry. However, electromagnetic interference has been found to sometimes undesirably affect operation of existing such resets circuits and cause the microprocessor to initially be in unknown states.

It is therefore a general object of the invention to provide a novel microprocessor reset circuit which will obviate or minimize difficulties of the type previously described.

It is a specific object of the invention to provide a microprocessor reset circuit which will reliably generate a reset signal when the power supply is "powered-up".

It is another object of the invention to provide a microprocessor reset circuit which may be implemented on a microprocessor chip.

SUMMARY OF THE INVENTION

One aspect of the invention which accomplishes at least some of the foregoing objects includes a reset circuit which generates a reset signal each time a microprocessor or other integrated circuit device is powered up. The reset circuit is connected to the same voltage source which powers the associated microprocessor. A first discharging means responsive to the voltage source discharges a circuit node to a ground state when the power supply is first powered up. This eliminates, at the very beginning of the power-up process, any charge that may exist on the node as a result of ambient electromagnetic fields, or the like. A first charging means responsive to the voltage source begins charging the node after a threshold voltage of the first charging means has been reached. A first inverter having a threshold voltage changes state in response to the voltage at the node, and a gating means coupled to the output of the first inverter is enabled by the output of the inverter. A second charging means responsive to the voltage supply is coupled to the gating means. A capacitor means begins charging in response to the gating means and the second charging means. A buffer means produces a reset signal when the capacitor means is charged to the switch point of the buffer means.

BRIEF DESCRIPTION OF THE DRAWINGS

Other advantages of the present invention will become apparent from the following detailed description of a preferred embodiment thereof taken in conjunction with the accompanying drawings, wherein.

DESCRIPTION OF A PREFERRED EMBODIMENT

Figure 1:
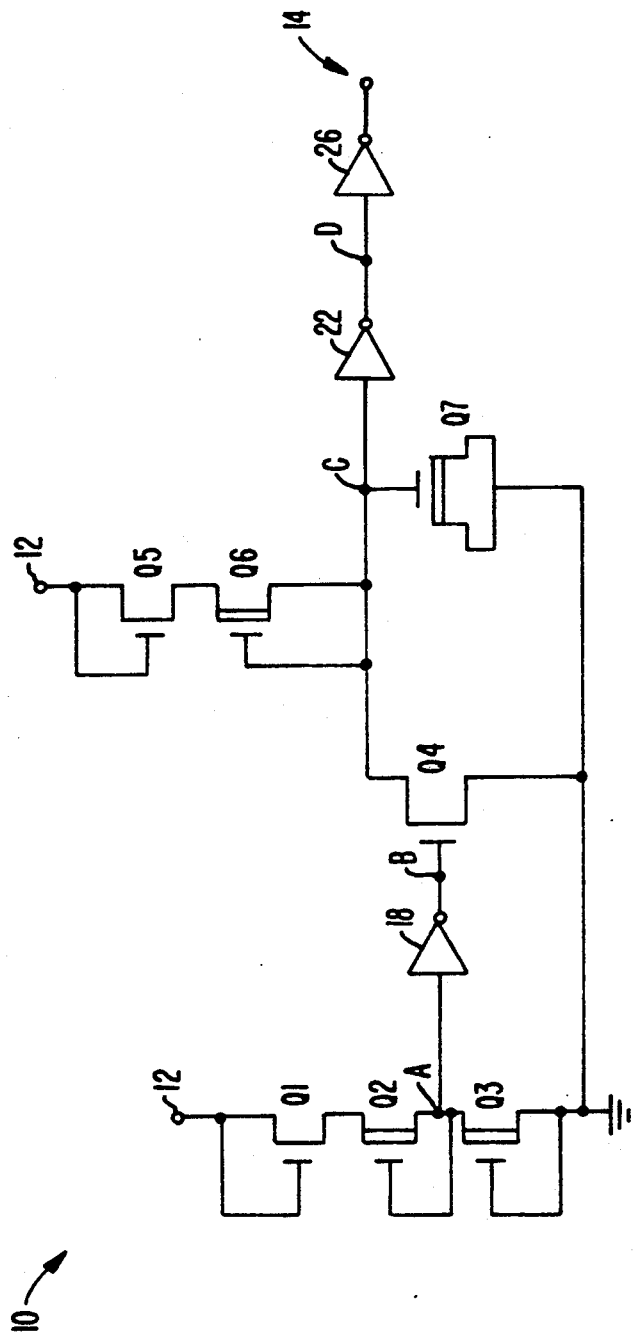
FIG. 1 is a schematic circuit diagram of the reset circuit of the present invention.

Referring to FIG. 1, a schematic circuit diagram of a reset circuit 10 is shown. The reset circuit 10 is coupled to a power supply 12 which also powers an associated microprocessor or other integrated circuit device, not shown. The reset circuit 10 generates a reset signal at node 14 when the power supply 12 has a sufficient voltage to permit proper operation of the associated microprocessor, or when the microprocessor is powered up. All elements in the specific embodiment of the present invention are fabricated using n-mos technology. All transistors in the circuit are metal-oxide semiconductor field effect transistors (MOSFETs).

The reset circuit includes enhancement-mode transistor Q1 and depletion-mode transistors Q2 and Q3. Transistor Q3 operably discharges node A prior to powering up of the voltage supply 12 so that the node is initialized to a ground state. The transistor Q3 is a weak depletion device (that is, has a high impedance between its source and drain) and is coupled to ground, as shown, to ensure that node A is discharged to ground each time the reset circuit is activated. The time allocated for node A to be discharged to a ground state is at least the time it takes for the power supply to ramp up to the threshold voltage of transistor Q1, which then begins to conduct. Until the power supply has reached the threshold voltage of transistor Q1, the transistor Q3 discharges the node and receives no contention from transistor Q1 since Q1 is nonconducting. Since node A is reliably discharged to ground every time the power supply ramps up, the circuit is substantially unaffected by electromagnetic interference since the node is in a defined logic state. The transistor Q2 is a strong depletion device (that is, has a low impedance between its source and drain) relative to transistor Q3. Transistors Q2 and Q3 form a voltage divider which charges node A as the voltage supply 12 delivers more power to the reset circuit 10, since Q2 eventually overpowers Q3. A reset signal is generated when the power supply to the microprocessor is initially turned on, or when the power supply dips below an operating level and the circuitry must be reset by the reset signal as the power reaches a sufficient voltage; hence the terminology "powered-up". More detailed operating characteristics will be given below in conjunction with example operating curves of FIG. 2.

An n-mos inverter 18 has its input coupled to node A and its output coupled to the gate of an enhancement-mode transistor Q4 at node B. When the input voltage to the inverter 18 reaches the switch point SP1 of the inverter, the output state of the inverter changes. More specifically, after node A has been initialized and begins charging, the input to the inverter 18 is a small voltage, or a logic "low", and so the output of the inverter at node B is logic "high". The "high" output of the inverter 18 enables the transistor Q4 so that it conducts. When the voltage at node A reaches the switch point SP1 of inverter 18, node B changes to a logic "low" and the transistor Q4 is disabled, or nonconducting. Inverter 18 does not invert its input until the power supply ramps up to at least two times the threshold voltage of transistor Q1. Note that the switch point of an inverter may be adjusted by circuit design, and depends upon the ratio of the pull-up to pull-down transistors coupled to the inverter. The pull-down transistors are enhancement-mode and the pull-up transistors are depletion-mode. The specific ratios used will not be given, as they are not necessary for an understanding of the present invention.

An enhancement-mode transistor Q5 is coupled to the voltage supply 12 and a weak depletion-mode transistor Q6. The voltage supply 12 is input to the drain of transistor Q5. Transistor Q6 is coupled to transistor Q4 at a node C, as shown. When the transistor Q4 is conducting, the charge which builds at node C is discharged through the transistor Q4 to ground. Node C is thus initialized to ground just as, and for the same amount of time as, node A is discharged to ground through transistor Q3.

Transistor Q4 is connected in parallel to an n-mos depletion-mode transistor Q7 which has its source and drain coupled together to ground so that the transistor Q7 acts as a capacitor. The gate of the transistor Q7 is coupled to the node C. As explained above, when the transistor Q4 is conducting, the charge which builds at node C is discharged through the transistor Q4. However, when the transistor Q4 is disabled, or nonconducting, the transistor Q7 begins to charge because it acts like a capacitor.

The voltage at node C is input to an inverter 22, which has a switch point SP2. When the transistor Q4 is conducting, no charge builds at the node C, which is also the input to the inverter 22. The input is therefore a logic "low", and the output at node D of the inverter 22 is a logic "high". The output of the inverter 22 at node D is input to another inverter 26 which converts the small signal to a large signal. The "high" input to inverter 26 produces a logic "low" at node 14, which is the reset line supplied to the associated microprocessor. Since the reset signal is active "high", the microprocessor is not reset when node 14 is a logic "low". As explained, when the transistor Q4 is not conducting, the voltage at node C increases because of the transistor/capacitor Q7. When the voltage at node C reaches the switch point SP2 of the inverter 22, the output of the inverter 22 changes state from a logic "high" to a logic "low". Accordingly, the "low" input to inverter 26 produces a "high" output at node 14, and the reset signal is generated.

Figure 2:
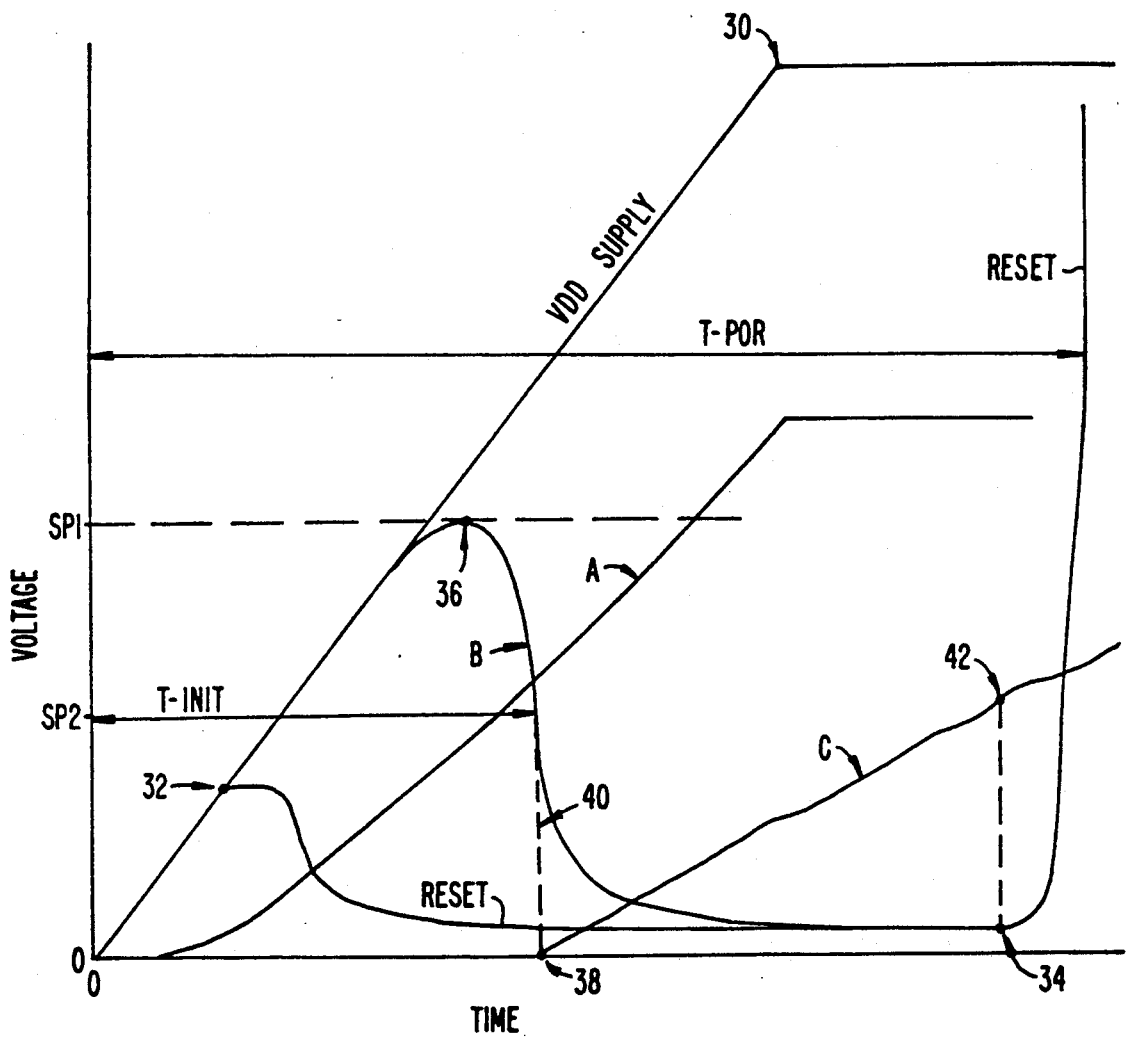
FIG. 2 is a graphical illustration of the characteristics of the reset circuit of FIG. 1.

An understanding of the operation of the reset circuit 10 may be facilitated by the graphical illustration of different circuit characteristics as shown in FIG. 2. The abscissa of the graph is time measured; the scale is not constant in order to facilitate illustration of the more important aspects of circuit operation. The ordinate of the graph is voltage and has a constant scale.

The input to the reset circuit 10 and the rest of a microprocessor is the voltage supply 12, illustrated by the line "VDD Supply" on the graph. The voltage supply increases steadily with time until the voltage reaches its maximum, shown as point 30 on the graph. The voltage remains at its maximum value after this point. The actual voltages and times at which transitions occur will not be noted, as these values are not essential for an understanding of the circuit operation.

The reset signal generated at node 14, indicated by the line "reset", increases with the power supply until point 32. At point 32, the reset signal dips to a low point and remains at a low voltage until the reset signal is activated at point 34. This is because when the voltage supply 12 begins ramping up, the second voltage divider composed of Q5 and Q6 charges the node C. Since Q4 is not conducting much, node 14 follows the voltage supply until Q4 begins discharging node C at point 32. The reset line then goes low because Q4 discharges node C, which in turn pulls the reset signal to a low voltage.

The voltage at node A is indicated on the graph by the line labelled "A". As shown by the line, the voltage at node A initially starts at approximately zero volts and remains there for a short time while Q3 is discharging the node. As the voltage supply ramps up, the weak depletion device Q3 is overpowered by transistors Q1 and Q2, as shown by the increase in the voltage at node A. The time allocated for node A to discharge to ground is equal to the time it takes for the voltage supply to ramp up to at least the threshold of Q1; again, Q1 is a large n-channel enhancement-mode device which is in saturation mode when VDD is greater than the threshold of Q1. The voltage at node A peaks at the same time that the voltage supply peaks, shown at point 30 on the "VDD Supply" line.

The voltage at node B is of particular interest since it controls the conduction of transistor Q4, and hence the time at which the capacitor Q7 begins charging. Node B initially follows the voltage supply 12 until point 36, at which time node A has reached the switch point SP1 of inverter 18. Note that the switch point shown on the graph is approximately equal to VDD/2, but may be adjusted to other values depending upon other circuit parameters. The output of the inverter 18, node B, then starts going low until the voltage supply is powered up again. As explained above, the voltage supply is powered up when the microprocessor is initially turned on, or when the power dips below its operating voltage and is reasserted. The reset circuit 10 reliably generates a reset signal to reinitialize the microprocessor after the voltage supply has reached a sufficient voltage. The time during which the reset circuit itself is initialized is labelled "T-INIT", and is the time during which node C is discharged and the reset signal goes low. Again, "T-INIT" may be altered by changing the switch point of inverter 18 to affect the point at which node B begins to go low.

After the reset circuit 10 has been initialized and node B is low, transistor Q4 is nonconducting and node C begins to charge, as shown at point 38 on the graph line labelled "C". The time at which node C begins charging is the same as the time at which node B crosses the switch point SP1 of inverter 18, and is labelled as line 40. The voltage at node C reaches the switch point SP2 of inverter 22 at point 42, and the reset signal begins to go high at point 34. The time it takes for reset to be asserted is labelled as "T-POR" on the graph. T-POR may be altered by varying the capacitance of transistor Q7; the longer it takes for node C to charge, the longer T-POR will be.

After reading and understanding the foregoing power-on reset circuit, in conjunction with the drawings, it will be appreciated that several distinct advantages of the subject invention are obtained. Without attempting to set forth all of the desirable features of the circuit, at least some of the major advantages of the invention include the use of transistor Q3 which initializes node A to ground each time the voltage supply is powered-up. Since the reset circuit 10 allocates at least the amount of time it takes for the voltage supply to ramp up to the threshold of Q1, Q3 is always given sufficient time to discharge node A to a ground state. This feature makes the circuit less susceptible to the effects of electromagnetic interference by eliminating the possibility that the node is floating. Transistor Q7 permits alteration of the time it takes to assert reset, or TPOR. Since the reset circuit is implemented on a microprocessor chip, it obviates use of a pin and external logic. The circuit is automatically triggered by a powering-up of the voltage supply, and is transparent to the user.

It should be noted that although the invention has been described with reference to specific embodiments, it should not be construed to be so limited. For instance, the transistors shown are implemented using MOSFETs, but they could be replaced with junction field effect or bipolar junction transistors. The circuit may be altered to employ cmos or p-mos technology, or the voltage supply could be replaced with a current supply. Transistor Q7 may be replaced with a different type of capacitive element. Those skilled in the art and familiar with the instant disclosure of the subject invention may recognize additions, deletions, modifications, substitutions and other changes which will fall within the purview of the subject invention and claims.

It is claimed:

1. In a circuit having a node connected to follow a voltage rise of a power supply from zero to full voltage after the power supply is turned on to an integrated circuit device, said circuit generating a reset signal a time thereafter related to characteristics of the voltage rise at said node, said reset signal being useable to initialize operation of the device, the improvement comprising means connected to the node for holding said node at a reference voltage level for a period of time at a start of said power supply voltage rise and until said voltage reaches a certain level that is significantly lower than its said full voltage, whereby any initial bias voltage on said node which might affect the timing of the reset signal is eliminated.

2. The combination according to claim 1 wherein said device includes a microprocessor, and further wherein said reset circuit and said microprocessor are provided on a single integrated circuit chip.

3. A circuit generating a reset signal each time a microprocessor or other integrated circuit device is powered-up by connection with an associated power supply, said circuit comprising:
   a first discharging means responsive to a voltage of said power supply for discharging a node to a ground potential during an initial period immediately after the power supply is powered-up;
   a first charging means responsive to said power supply voltage for charging the node beginning after said initial period in response to an increasing power supply voltage, said first charging means being coupled to said first discharging means at said node;
   a first inverter having an input coupled to said node and an output, said first inverter having a switch point voltage at which the inverter output changes from a first state when said node voltage is below said switch point to a second state when said node voltage exceeds said switch point; and
   means receiving said first inverter output for generating said reset signal at a controlled time after the instant when said inverter output switches from said first to said second state in response to a rising power supply voltage.

4. A circuit generating a reset signal each time a microprocessor or other integrated circuit device is powered-up by connection with an associated power supply, said circuit comprising:
   a first discharging means responsive to a voltage of said power supply for discharging a node to a ground potential during an initial period immediately after the power supply is powered-up;
   a first charging means responsive to said power supply voltage for charging the node after said initial period in response to an increasing power supply voltage, said first charging means being coupled to said first discharging means at said node;
   a first inverter having an input coupled to said node and an output, said first inverter having a switch point voltage at which the inverter output changes from a first state when said node voltage is below said switch point to a second state when said node voltage exceeds said switch point; and
   means receiving said first inverter output for generating said reset signal at a controlled time after the instant when said inverter output switches from said first to said second state in response to a rising power supply voltage, said reset signal generating means including:
      gating means coupled to the output of said first inverter, said gating means being enabled by the output signal of said first inverter;
      a second charging means responsive to the voltage of said power supply and being coupled to said gating means;
      capacitor means for storing charge in response to said gating means being disabled, said capacitor means affecting the time period it takes for the reset signal to be asserted; and
      buffer means having an input and an output, the input of said buffer means being coupled to said gating means, said capacitor means, and said second charging means, and said buffer means having a switch point voltage for changing from a first state to a second state, such that when said capacitor means is charged to the switch point voltage of said buffer means, the output of said buffer means will change state and thereby produce said reset signal.

5. The reset circuit as defined in claim 3 wherein:
   said first charging means and said discharging means include individual field effect transistor resistors having significantly different impedances wherein said discharging means is characterized by having the higher impedance.

6. The reset circuit as defined in claim 3 wherein said first charging means further comprises:
   a first transistor being coupled to the power supply; and
   a second transistor being coupled between said first transistor and said node.

7. The reset circuit as defined in claim 6 wherein:
said first transistor comprises an n-channel enhancement field effect transistor having a source, a drain, and a gate, said gate being coupled to said voltage supply; and
said second transistor comprises an n-channel depletion field effect transistor having a source, a drain, and a gate, said gate being coupled to the source of said n-channel enhancement transistor, said gate being coupled to its source and to the input of said first inverter.

8. A reset circuit as defined in claim 4 wherein said discharging means comprises an n-channel depletion transistor having a source, a drain, and a gate, said drain being coupled to the source of an n-channel depletion transistor of said first charging means, and whose source is coupled to its gate and to ground.

9. The reset circuit as defined in claim 4 wherein said capacitor means comprises an n-mos depletion-mode transistor.

10. The reset circuit as defined in claim 4 wherein said second charging means further comprises:
an n-channel enhancement field effect transistor having a source, a drain, and a gate, said drain being coupled to said voltage supply; and
an n-channel depletion field effect transistor having a source, a drain, and a gate, said drain being coupled to the source of said n-channel enhancement transistor, and said gate being coupled to said gating means.

11. The reset circuit as defined in claim 4 wherein said buffer means comprises:
a first inverter having an input and an output; and
a second inverter having an input and an output, the output of said first inverter being coupled to the input of said second inverter, said second inverter amplifying signals received from said first inverter.

12. The reset circuit as defined in claim 4 wherein said gating means comprises an n-channel enhancement field effect transistor having a source, a gate, and a drain, said gate being coupled to said first inverter, said source being coupled to ground, said drain being coupled to said second charging means, said gating means being disabled when said inverter reaches its switch point.

13. A circuit generating a reset signal in response to an electronic circuit device being powered-up by connection with an associated power supply, said circuit comprising:
a series circuit including first and second circuit portions joined at a node and connectable across said power supply;
means connected to said node for generating said reset signal when a voltage on the node rises past a predetermined threshold as the power supply voltage rises from zero to full voltage, and
said first series circuit portion is characterized by being conductive during a period during which the power supply voltage rises from zero to cause the node voltage to reach said predetermined threshold and the second series circuit portion is characterized by being non-conductive during a beginning portion during said voltage rise period and conductive thereafter until said node voltage reaches said predetermined threshold,
whereby said node is discharged to a power supply terminal during the beginning portion of the voltage rise.

14. The circuit according to claim 13 wherein said first series circuit portion includes a depletion mode n-mos field effect transistor and said second series circuit portion includes an enhancement mode n-mos field effect transistor.

* * * * *